United States Patent
Yuan et al.

(10) Patent No.: US 11,155,913 B2
(45) Date of Patent: Oct. 26, 2021

(54) EVAPORATION MASK PLATE, MANUFACTURING METHOD THEREOF AND EVAPORATION METHOD

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Hongguang Yuan, Beijing (CN); Pilgeun Chun, Beijing (CN); Yan Hu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 458 days.

(21) Appl. No.: 15/751,467

(22) PCT Filed: Aug. 3, 2017

(86) PCT No.: PCT/CN2017/095740
§ 371 (c)(1),
(2) Date: Feb. 8, 2018

(87) PCT Pub. No.: WO2018/137328
PCT Pub. Date: Aug. 2, 2018

(65) Prior Publication Data
US 2020/0239997 A1   Jul. 30, 2020

(30) Foreign Application Priority Data
Jan. 24, 2017   (CN) .......................... 201710055092.7

(51) Int. Cl.
*C23C 14/04* (2006.01)
*C23C 14/12* (2006.01)
(Continued)

(52) U.S. Cl.
CPC ............ *C23C 14/042* (2013.01); *C23C 14/12* (2013.01); *C23C 14/24* (2013.01);
(Continued)

(58) Field of Classification Search
CPC .......................... C23C 14/042; H01L 51/0011
See application file for complete search history.

(56) References Cited

U.S. PATENT DOCUMENTS

2003/0189400 A1* 10/2003 Nishio .................... H01L 51/56
                                                               313/504
2004/0135498 A1   7/2004 Takanosu et al.
(Continued)

FOREIGN PATENT DOCUMENTS

CN   1443026 A   9/2003
CN   1607868 A   4/2005
(Continued)

OTHER PUBLICATIONS

International Search Report and Written Opinion dated Nov. 10, 2017, for corresponding PCT Application No. PCT/CN2017/095740.
(Continued)

*Primary Examiner* — Selim U Ahmed
*Assistant Examiner* — Evan G Clinton
(74) *Attorney, Agent, or Firm* — Kinney & Lange, P.A.

(57) ABSTRACT

An evaporation mask plate, a manufacturing method thereof and an evaporation method are provided. The evaporation mask plate includes a body, a plurality of evaporation cutout regions formed in the body, and a plurality of shielding
(Continued)

members arranged on the body. Each shielding member is arranged between two adjacent evaporation cutout regions.

8 Claims, 4 Drawing Sheets

(51) Int. Cl.
*C23C 14/24* (2006.01)
*H01L 51/00* (2006.01)
*H01L 51/56* (2006.01)
*H01L 27/32* (2006.01)
*H01L 51/50* (2006.01)

(52) U.S. Cl.
CPC .......... *H01L 51/0011* (2013.01); *H01L 51/56* (2013.01); *H01L 27/3246* (2013.01); *H01L 27/3283* (2013.01); *H01L 51/5012* (2013.01)

(56) References Cited

U.S. PATENT DOCUMENTS

| 2005/0072359 | A1 | 4/2005 | Kim |
| 2007/0159048 | A1 | 7/2007 | Chang et al. |
| 2013/0015444 | A1 | 1/2013 | Hirai |
| 2016/0026089 | A1 | 1/2016 | Chen |
| 2017/0025611 | A1* | 1/2017 | Huang ................ H01L 51/0011 |
| 2017/0213879 | A1* | 7/2017 | Yang ................... H01L 27/3246 |
| 2017/0244036 | A1* | 8/2017 | Okawara ............... C23C 14/042 |

FOREIGN PATENT DOCUMENTS

| CN | 102877022 A | 1/2013 |
| CN | 103713466 | 4/2014 |
| CN | 203999787 U | 12/2014 |
| CN | 104867963 A | 8/2015 |
| CN | 105154823 A | 12/2015 |
| CN | 105633301 A | 6/2016 |
| CN | 105714249 A | 6/2016 |
| CN | 106367716 A | 2/2017 |
| CN | 106816554 A | 6/2017 |

OTHER PUBLICATIONS

First Chinese Office Action dated Jan. 3, 2018, for corresponding Chinese Application No. 201710055092.7.
Third Chinese Office Action dated May 7, 2019, received for corresponding Chinese Application No. 201710055092.7.
Chinese Office Action dated Sep. 27, 2018, received for corresponding Chinese Application No. 201710055092.7.

* cited by examiner

EVAPORATION MASK PLATE, MANUFACTURING METHOD THEREOF AND EVAPORATION METHOD

CROSS-REFERENCE TO RELATED APPLICATIONS

The present application is the U.S. national phase of PCT Application No. PCT/CN2017/095740 filed on Aug. 3, 2017, which claims a priority of the Chinese patent application No. 201710055092.7 filed on Jan. 24, 2017, which are incorporated herein by reference in their entireties.

TECHNICAL FIELD

The present disclosure relates to the field of display technology, in particular to an evaporation mask plate, a manufacturing method thereof, and an evaporation method.

BACKGROUND

During the manufacture of an Organic Light-Emitting Diode (OLED) display substrate, usually an evaporation process is adopted so as to form organic light-emitting layers. However, during the evaporation, a color blending phenomenon may easily occur for the adjacent organic light-emitting layers in different colors.

SUMMARY

An object of the present disclosure is to provide an evaporation mask plate, a manufacturing method thereof and an evaporation method, so as to prevent the occurrence of the color blending phenomenon for the adjacent organic light-emitting layers in different colors.

In one aspect, the present disclosure provides in some embodiments an evaporation mask plate, including a body, a plurality of evaporation cutout regions formed in the body, and a plurality of shielding members arranged on the body. Each shielding member is arranged between two adjacent evaporation cutout regions.

In a possible embodiment of the present disclosure, each shielding member is merely arranged between the two adjacent evaporation cutout regions for forming organic light-emitting layers in different colors through evaporation.

In a possible embodiment of the present disclosure, each shielding member has a thickness of 2.5 µm to 3 µm, and a line width of 8 µm to 12 µm.

In a possible embodiment of the present disclosure, each shielding member is of a hemispherical, near-spherical, cylindrical or cuboidal shape.

In a possible embodiment of the present disclosure, each shielding member is made of a photoresist.

In a possible embodiment of the present disclosure, the plurality of shielding members and the plurality of evaporation cutout regions are arranged alternately in at least one direction.

In a possible embodiment of the present disclosure, the body is of a lattice structure having a plurality of grids, and each evaporation cutout region forms the grid of the lattice structure.

In a possible embodiment of the present disclosure, the body includes a frame, a plurality of first extension members and a plurality of second extension members. Each of the plurality of first extension members and the plurality of second extension members is of a strip-like shape and arranged inside the frame. The plurality of first extension members extends in a row direction and is spaced apart from each other in a column direction. The plurality of second extension members extends in the column direction and is spaced apart from each other in the row direction. The plurality of first extension members crosses the plurality of second extension members, so as to form the plurality of grids.

In a possible embodiment of the present disclosure, the plurality of shielding members are arranged evenly in a matrix form on the plurality of second extension members. The plurality of shielding members and the evaporation cutout regions are arranged alternately in the row direction, and the plurality of shielding members and the plurality of first extension members are arranged alternately in the column direction.

In a possible embodiment of the present disclosure, the plurality of shielding members covers all of the plurality of second extension members.

In a possible embodiment of the present disclosure, each shielding member is of a strip-like shape and extends in the column direction, and the plurality of shielding members is spaced apart from each other in the row direction.

In a possible embodiment of the present disclosure, the plurality of shielding members covers all of the plurality of second extension members and all of the plurality of the first extension members.

In a possible embodiment of the present disclosure, the plurality of shielding members is of a grid-like structure.

In another aspect, the present disclosure provides in some embodiments an evaporation method for forming an organic light-emitting layer of an OLED display substrate using the above-mentioned evaporation mask plate, including steps of: placing the evaporation mask plate opposite to a base substrate in such a manner that the plurality of shielding members of the evaporation mask plate directly face a pixel definition layer on the base substrate; and evaporating an organic light-emitting material using the evaporation mask plate.

In a possible embodiment of the present disclosure, prior to placing the evaporation mask plate opposite to the base substrate in such a manner that the plurality of shielding members of the evaporation mask plate directly face the pixel definition layer on the base substrate, the evaporation method further includes forming the pixel definition layer having a thickness of 0.75 µm to 1µm and a line width of 8 µm to 12 µm on the base substrate.

In yet another aspect, the present disclosure provides in some embodiments an OLED display substrate including an organic light-emitting layer formed by the above-mentioned evaporation method.

In a possible embodiment of the present disclosure, the OLED display substrate includes a pixel definition layer having a thickness of 0.75 µm to 1µm and a line width of 8 µm to 12 µm.

In still yet another aspect, the present disclosure provides in some embodiments an OLED display device including the above-mentioned OLED display substrate.

In still yet another aspect, the present disclosure provides in some embodiments a method for manufacturing the above-mentioned evaporation mask plate, including steps of: providing a base plate of the evaporation mask plate, the base plate including a body and a plurality of evaporation cutout regions formed in the body; and forming a photoresist layer onto the base plate, and subjecting the photoresist layer to a photoetching process, so as to form a plurality of shielding members each arranged between two adjacent evaporation cutout regions.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
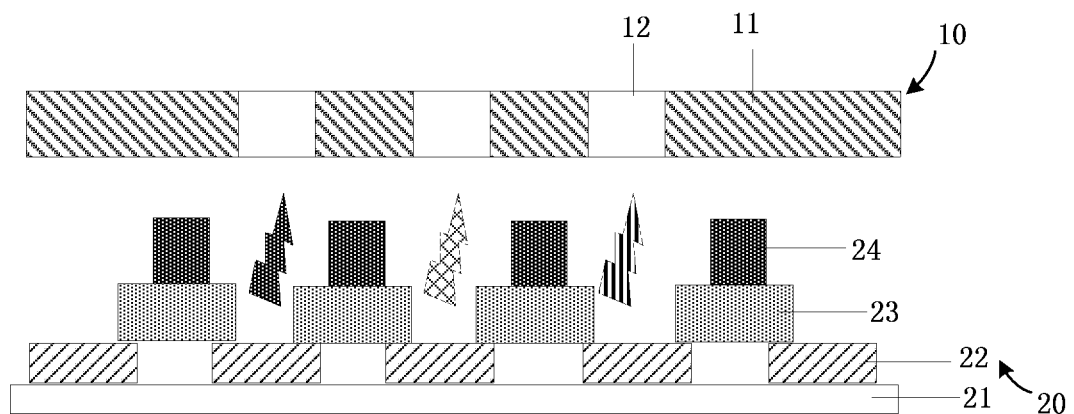
FIG. 1 is a schematic view showing an evaporation method for forming an organic light-emitting layer of an OLED display substrate in a related art.

As shown in FIG. 1, which is a schematic view showing an evaporation method for forming an organic light-emitting layer of an OLED display substrate in a related art, during the evaporation, a Fine Metal Mask (FMM) 10 needs to be used, so as to form organic light-emitting layers in different colors on the OLED display substrate 20. The FMM 10 includes a body 11 and a plurality of evaporation cutout regions 12 formed in the body 11 and spaced apart from each other. The OLED display substrate 20 includes a base substrate 21, an anode 22 and a pixel definition layer 23. In order to prevent the occurrence of a color blending phenomenon for the adjacent organic light-emitting layers in different colors during the evaporation, usually it is necessary to increase a thickness and a line width (CD) of the pixel definition layer (PDL) 23, and meanwhile provide a spacer (post spacer (PS)) 24 above the pixel definition layer 23, thereby to further increase the thickness and facilitate the isolation from the anode 22. However, inevitably a resolution and an aperture ratio of an OLED product may be adversely affected to some extent, so it is very difficult to acquire the product with a high Pixel Per Inch (PPI). In addition, due to the additional process for forming the spacer, more organic materials (for forming PDL+PS) are used, so the manufacture cost may increase.

During the formation of the organic light-emitting layers of the OLED display substrate through evaporation, it is necessary to provide the pixel definition layer having a relatively large thickness and the spacer, so as to prevent the occurrence of the color blending phenomenon for the adjacent organic light-emitting layers in different colors, which however results in a low resolution and a low aperture ratio of the OLED display substrate and a high manufacture cost. An object of the present disclosure is to provide an evaporation mask plate, a manufacturing method thereof and evaporation method, so as to solve the above-mentioned problem.

The present disclosure will be described hereinafter in more details in conjunction with the drawings and embodiments. The following embodiments are for illustrative purposes only, but shall not be used to limit the scope of the present disclosure.

Figure 2:
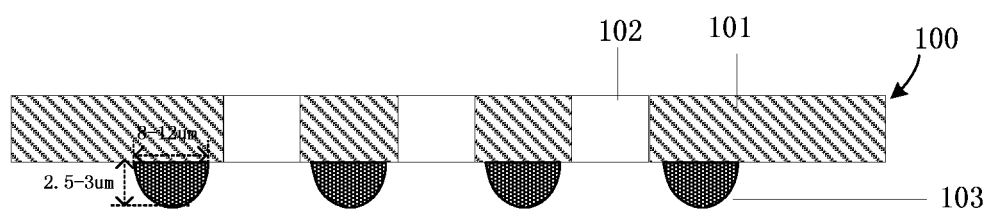
FIG. 2 is a sectional view of an evaporation mask plate according to one embodiment of the present disclosure.

Referring to FIG. 2, which is a sectional view of an evaporation mask plate in the embodiments of the present disclosure, the evaporation mask plate 100 includes a body 101, evaporation cutout regions 102 formed in the body 101, and a plurality of shielding members 103 arranged on the body 101. Each shielding member 103 is at least arranged between two adjacent evaporation cutout regions 102 for forming organic light-emitting layers in different colors through evaporation. Through the shielding member 103 between the adjacent evaporation cutout regions 102 for forming the organic light-emitting layers in different colors, it is able to prevent or reduce the occurrence of color blending phenomenon for the adjacent organic light-emitting layers in different colors during the formation of the organic light-emitting layers of an OLED display substrate through evaporation.

In a possible embodiment of the present disclosure, the plurality of shielding members 103 and the plurality of evaporation cutout regions 102 are arranged alternately in at least one direction.

Figure 3:
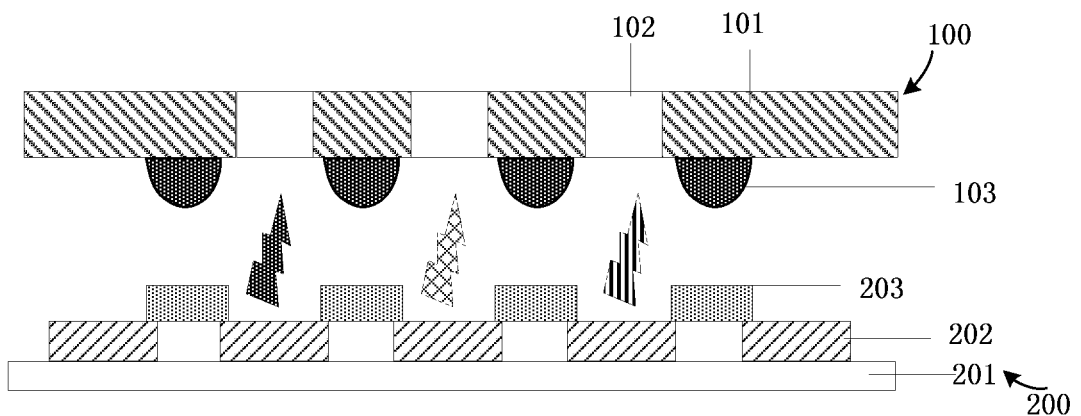
FIG. 3 is a schematic view showing an evaporation method for forming an organic light-emitting layer of an OLED display substrate using the evaporation mask plate in FIG. 2.

Referring to FIG. 3, which is a schematic view showing an evaporation method for forming an organic light-emitting layer of an OLED display substrate using the evaporation mask plate in FIG. 2, the OLED display substrate 200 includes a base substrate 201, an anode 202 and a pixel definition layer 203. Of course, the OLED display substrate 200 in the embodiments of the present disclosure may further include any other layers (e.g., a thin film transistor functional layer), which is not a focus of the present disclosure and thus will not be particularly defined herein.

As shown in FIG. 3, the evaporation mask plate 100 is provided with the shielding members 103. During the formation of the organic light-emitting layers through evaporation, evaporation materials for forming the adjacent organic light-emitting layers in different colors may be shielded by the shielding members 103, so it is able to prevent the occurrence of the color blending phenomenon for the organic light-emitting layers without providing any shielding members on the OLED display substrate 200, thereby to reduce the amount of the consumed organic materials, reduce the number of process steps, and shorten the processing time. In addition, it is also able to reduce the thickness and the line width of the pixel definition layer 203 on the OLED display substrate 200, thereby to further reduce the amount of the consumed organic materials and reduce the manufacture cost. Further, it is also able to increase the resolution and the aperture ratio of the OLED display substrate.

In a possible embodiment, as shown in FIG. 2, each shielding member 103 has a thickness of 2.5 µm to 3 µm, and a line width (CD) of 8 µm to 12 µm.

In FIGS. 2 and 3, each shielding member 103 may be of a hemispherical or near-spherical shape. Of course, the shape of the shielding member is not limited thereto, e.g., the shielding member may also be of a cylindrical or cuboidal shape.

Figure 4:
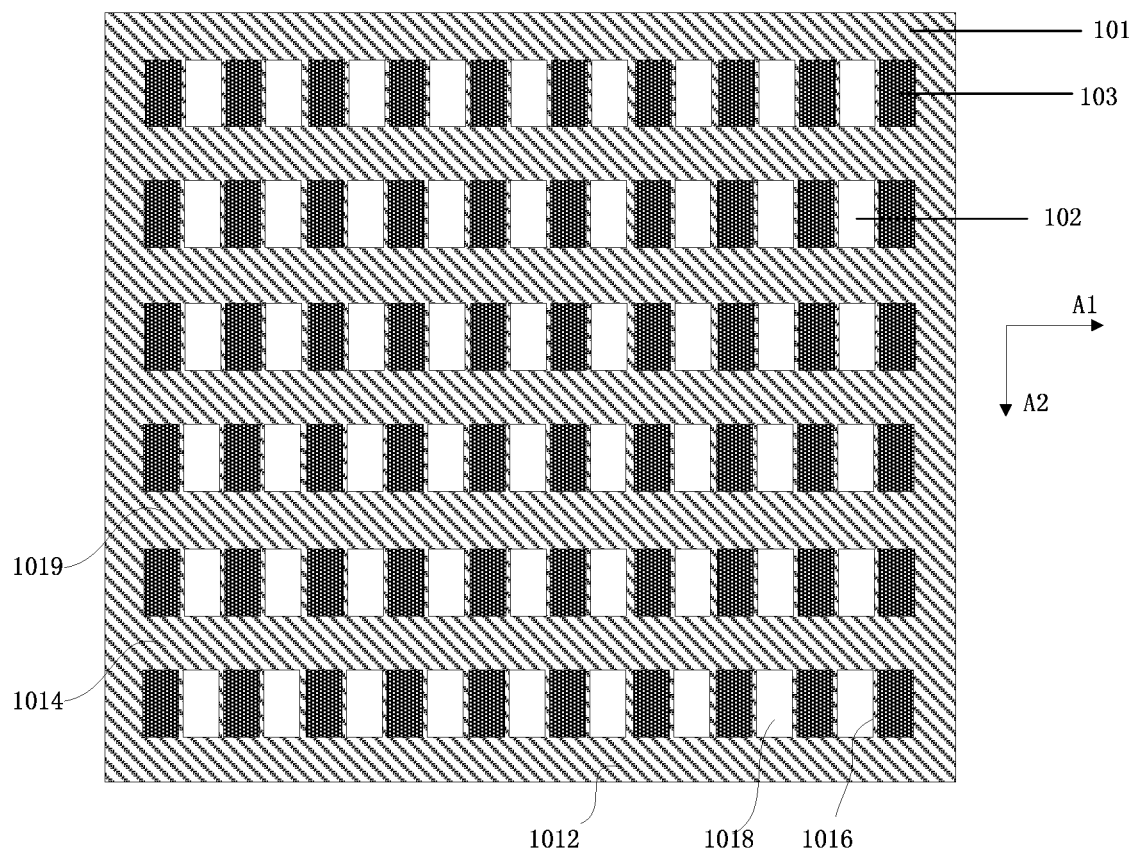
FIG. 4 is a bottom view of the evaporation mask plate according to one embodiment of the present disclosure.

Referring to FIG. 4 which is a bottom view of the evaporation mask plate, the evaporation mask plate includes a plurality of shielding members 103 arranged evenly in a matrix form. In a row direction (e.g., a direction indicated by arrow A1 in FIG. 4, also called as a first direction), the shielding members 103 and the evaporation cutout regions 102 are arranged alternately. In a possible embodiment of the present disclosure, each shielding member 103 may be of a shape and a size identical to those of each evaporation cutout region 102. Of course, in some other embodiments of the present disclosure, the shape and size of each shielding member 103 may be different from those of the evaporation cutout region 102, as long as a length of each shielding member 103 is greater than or equal to a length of each evaporation cutout region 102 in a column direction (e.g., a direction indicated by arrow A2 in FIG. 4, also called as a second direction).

On the OLED display substrate, the organic light-emitting layers in an identical column may be of an identical color. For the organic light-emitting layers in an identical row, all adjacent organic light-emitting layers have different colors. Hence, on the evaporation mask plate, each shielding member 103 may merely be arranged between the adjacent evaporation cutout regions 102 for forming the organic light-emitting layers in different colors through evaporation, and it may not be arranged at any other regions. Through this kind of structure, it is able to effectively reduce the amount of materials for forming the shielding members 103.

As shown in FIG. 4, the body 101 may be of a lattice structure including a plurality of grids, and each evaporation cutout region 102 is just a grid of the lattice structure. To be specific, the body 101 includes a frame 1012, a plurality of first extension members 1014 and a plurality of second extension members 1016. Each of the first extension members 1014 and the second extension members 1016 is of a strip-like shape and arranged inside the frame 1012. The plurality of first extension members 1014 extends in a row direction and is spaced apart from each other in a column direction. The plurality of second extension members 1016 extends in the column direction and is spaced apart from each other in the row direction. The plurality of first extension members 1014 crosses the plurality of second extension members 1016, so as to form the plurality of grids 1018, i.e., the evaporation cutout regions 102.

As shown in FIG. 4, each shielding member 103 is merely arranged on the corresponding second extension member 1016, rather than on the first extension member 1014 and at a boundary 1019 between the second extension member 1016 and the first extension member 1014. In this way, in the row direction, the shielding members 103 and the evaporation cutout regions 102 are arranged alternately, and in the column direction, the shielding members 103 and the first extension members 1014 are arranged alternately, so as to prevent the occurrence of the color blending phenomenon for the organic light-emitting layers, and reduce the amount of the materials for forming the shielding members 103.

Figure 5:
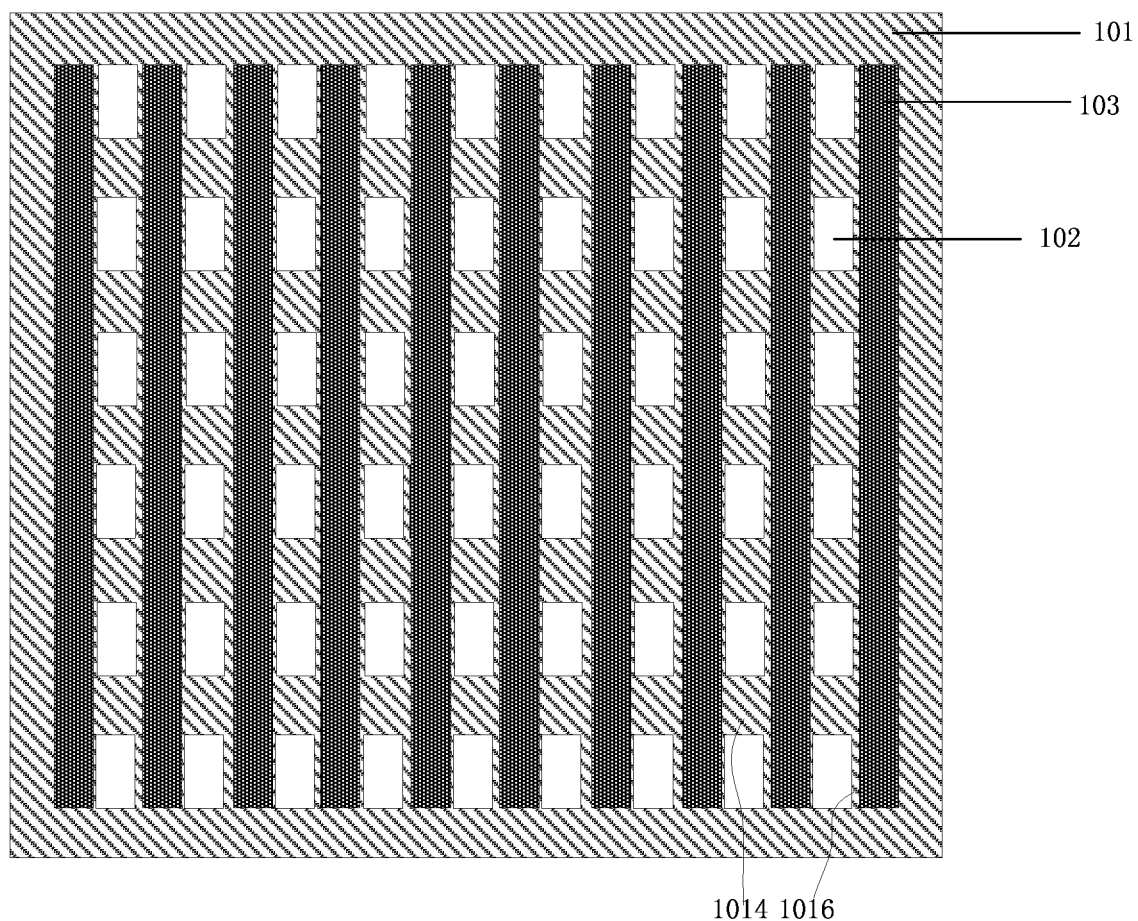
FIG. 5 is another bottom view of the evaporation mask plate according to one embodiment of the present disclosure.
Figure 6:
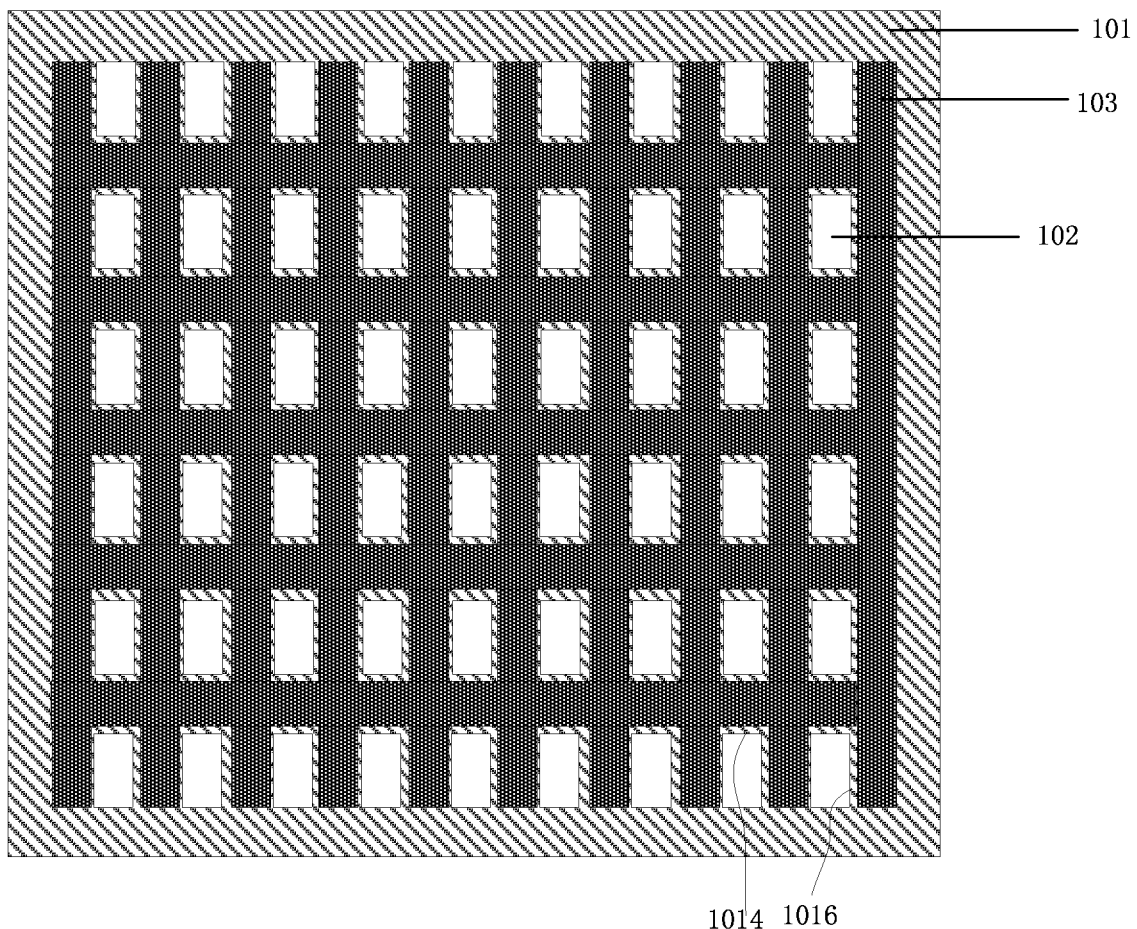
FIG. 6 is yet another bottom view of the evaporation mask plate according to one embodiment of the present disclosure.

Of course, the shielding members 103 may also be arranged in any other modes, as shown in FIGS. 5 and 6.

FIG. 5 is a bottom view of the evaporation mask plate, which differs from the evaporation mask plate in FIG. 4 in that the shielding members 103 in FIG. 5 cover all the second extension members 1016. In other words, each shielding member 103 is of a strip-like shape and extends in the column direction, and all the shielding members 103 are arranged alternately in the row direction.

FIG. 6 is a bottom view of the evaporation mask plate, which differs from the evaporation mask plate in FIG. 4 in that the shielding members 103 in FIG. 6 cover all the second extension members 1016 and all the first extension members 1014. In other words, the shielding members 103 are of a grid-like structure. In this way, it is able to further prevent the occurrence of the color blending phenomenon for the organic light-emitting layers.

Figure 7:
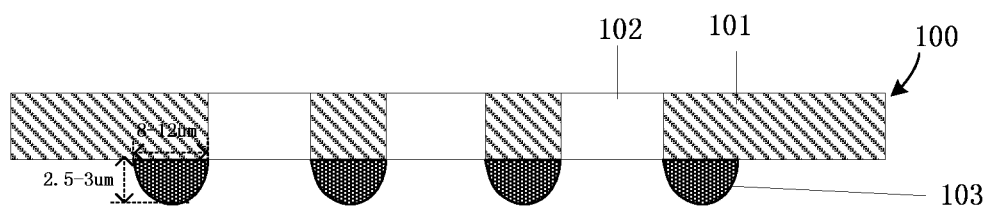
FIG. 7 is another sectional view of the evaporation mask plate according to one embodiment of the present disclosure.

In a possible embodiment of the present disclosure, each shielding member 103 is spaced apart from the corresponding evaporation cutout region 102 by a certain distance, as shown in FIG. 2. Of course, in some other embodiments of the present disclosure, there may be no gap between the shielding member and the corresponding evaporation cutout region 102, as shown in FIG. 7.

In a possible embodiment of the present disclosure, each shielding member is made of a photoresist, so as to simplify the manufacture process. For example, a photoetching process, a printing process or a transferring process may be used. In addition, when the shielding member needs to be replaced after long-term use, it is relatively easy to remove the photoresist. Of course, in some other embodiments of the present disclosure, the shielding members may also be made of any other materials, e.g., metal.

In a possible embodiment of the present disclosure, the evaporation mask plate may be an FMM.

The present disclosure further provides in some embodiments an evaporation method for forming the organic light-emitting layers on the OLED display substrate using the above-mentioned evaporation mask plate.

The evaporation mask plate is provided with the shielding members, and during the formation of the organic light-emitting layers through evaporation, the shielding members may shield the evaporation materials for forming the adjacent organic light-emitting layers in different colors, so as to prevent the occurrence of the color blending phenomenon for the organic light-emitting layers without arranging any spacers for shielding on the OLED display substrate, thereby to reduce the amount of the consumed organic materials (the amount of the consumed materials for forming the spacers for shielding on the OLED display substrate is reduced by 100%), reduce the process steps and shorten the processing time. In addition, it is also able to reduce the thickness and the line width of the pixel definition layer on the OLED display substrate, thereby to further reduce the amount of the consumed organic materials and reduce the manufacture cost.

In a possible embodiment of the present disclosure, prior to forming the organic light-emitting layer of the OLED display substrate, the evaporation method further includes forming the pixel definition layer having a thickness of 0.75 µm to 1 µm and a line width of 8 µm to 12 µm. In the related art, the pixel definition layer has a line width of 18 µm to 24 µm and a thickness of 1.5 µm to 2 µm. As compared with the related art, it is able to reduce the consumed material for forming the pixel definition layer by 30% to 50%, or even more than 50%.

The present disclosure further provides in some embodiments an OLED display substrate, including an organic light-emitting layer formed using the above-mentioned evaporation method.

In a possible embodiment of the present disclosure, the OLED display substrate does not include any spacer for preventing the occurrence of the color blending phenomenon for the organic light-emitting layers during the evaporation. As a result, it is able to reduce the amount of the consumed materials for forming the spacers, omit the process for forming the spacers on the OLED display substrate, and shorten the processing time.

The OLED display substrate further includes a pixel definition layer. In a possible embodiment of the present disclosure, the pixel definition layer has a thickness of 0.75) μm to 1 μm and a line width of 8 μm to 12 μm.

In a possible embodiment of the present disclosure, the OLED display substrate may be a flexible display substrate or a rigid display substrate.

The present disclosure further provides in some embodiments an OLED display device including the above-mentioned OLED display substrate.

The present disclosure further provides in some embodiments a method for manufacturing the above-mentioned evaporation mask plate, which includes: Step S11 of providing a base plate of the evaporation mask plate, the base plate including a body and evaporation cutout regions formed in the body; Step S12 of applying a photoresist layer onto the base plate; and Step 13 of subjecting the photoresist layer to a photoetching process (including exposing, developing, etching and removing processes), so as to form patterns of a plurality of shielding members arranged on the body. Each shielding member is at least arranged between the adjacent evaporation cutout regions for forming the organic light-emitting layers in different colors through evaporation.

In a possible embodiment of the present disclosure, each shielding member may be made of a photoresist, so as to simplify the manufacture process. In addition, when the shielding member is to be replaced after long-term use, it is also relatively easy to remove the photoresist.

In a possible embodiment of the present disclosure, each shielding member is formed through a photoetching process. Of course, it may also be formed through a printing process or a transferring process.

In a possible embodiment of the present disclosure, each shielding member is made of the photoresist. Of course, in some other embodiments of the present disclosure, the shielding member may also be made of any other materials, e.g., metal.

In a possible embodiment of the present disclosure, in order to ensure the evaporation effect, it is necessary to ensure an accurate size of the shielding member. For example, each shielding member may have a thickness of 2.5 μm to 3 μm (with an error of ±0.2 μm) and a line width of 8 μm to 12 μm (with an error of ±0.8 μm).

Further, in order to ensure the evaporation effect, the shielding members of the evaporation mask plate may be replaced periodically. In a possible embodiment of the present disclosure, the shielding members may be replaced as follows. 1) A desired photoresist pattern may be formed, in a factory, on the base plate of the evaporation mask plate through a photoetching process in accordance with a product type, and the photoresist pattern be renewed periodically, so as to ensure the evaporation effect. However, it is necessary to provide an exposing and developing device in this mode. 2) During the manufacture of the evaporation mask plate, the manufacturer is required to form the desired photoresist pattern, and the evaporation mask plate may be returned to the factory so as to renew the photoresist pattern. This mode is time-consuming, but the equipment cost may be reduced.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An evaporation mask plate, comprising:
   a body,
   a plurality of evaporation cutout regions formed in the body, and
   a plurality of shielding members arranged on the body, wherein:
   each shielding member of the plurality of shielding members is arranged between two adjacent evaporation cutout regions,
   each shielding member is only between two adjacent evaporation cutout regions of the plurality of evaporation cutout regions for forming organic light-emitting layers in different colors through evaporation,
   the body is of a lattice structure having a plurality of grids, and the evaporation cutout region forms the grid of the lattice structure,
   the body comprises a frame, a plurality of first extension members and a plurality of second extension members,
   each of the plurality of first extension members and the plurality of second extension members is of a strip-like shape and arranged inside the frame,
   the plurality of first extension members extends in a row direction and is spaced apart from each other in a column direction,
   the plurality of second extension members extends in the column direction and is spaced apart from each other in the row direction,
   the plurality of first extension members crosses the plurality of second extension members, so as to form the plurality of grids,
   the plurality of shielding members are arranged evenly in a matrix form on the plurality of second extension members, the plurality of shielding members and the evaporation cutout regions are arranged alternately in the row direction, and the plurality of shielding members and the plurality of first extension members are arranged alternately in the column direction,
   each shielding member is of a shape and a size approximately equal to a shape and a size of each evaporation cutout region, and
   each shielding member is merely arranged at a corresponding second extension member, not at the first extension member and not at a boundary between the second extension member and the first extension member.

2. The evaporation mask plate according to claim 1, wherein the shielding member has a thickness of 2.5 μm to 3 μm, and a line width of 8 μm to 12 μm.

3. The evaporation mask plate according to claim 2, wherein the shielding member is of a shape comprising at least one selected from the group consisting of a hemispherical, near-spherical, cylindrical and cuboidal shape.

4. The evaporation mask plate according to claim 1, wherein a material of the shielding member is a photoresist.

5. The evaporation mask plate according to claim 1, wherein the plurality of shielding members and the plurality of evaporation cutout regions are arranged alternately in at least one direction.

6. An evaporation method for forming organic light-emitting layers of an organic light-emitting diode display substrate using the evaporation mask plate according to claim 1, comprising:

placing the evaporation mask plate opposite to a base substrate in such a manner that the plurality of shielding members of the evaporation mask plate directly face a pixel definition layer on the base substrate; and evaporating an organic light-emitting material using the evaporation mask plate.

7. The evaporation method according to claim 6, wherein prior to placing the evaporation mask plate opposite to the base substrate in such a manner that the plurality of shielding members of the evaporation mask plate directly face the pixel definition layer on the base substrate, the evaporation method further comprises forming the pixel definition layer having a thickness of 0.75 μm to 1 μm and a line width of 8 μm to 12 μm on the base substrate.

8. A method for manufacturing the evaporation mask plate according to claim 1, comprising:

providing a base plate of the evaporation mask plate, the base plate including the body and the plurality of evaporation cutout regions formed in the body; and forming a photoresist layer onto the base plate, and subjecting the photoresist layer to a photoetching process, so as to form the plurality of shielding members each arranged between two adjacent evaporation cutout regions.

* * * * *